United States Patent
Song et al.

(10) Patent No.: US 9,329,441 B2
(45) Date of Patent: May 3, 2016

(54) DISPLAY DEVICE

(71) Applicant: Samsung Display Co., Ltd., Yongin, Gyeonggi-Do (KR)

(72) Inventors: Sung-Hoon Song, Asan-si (KR); Jae Yong Kim, Cheonan-si (KR); Tae-Kyu Kim, Hwaseong-si (KR); Wi Jin Nam, Busan (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/449,625

(22) Filed: Aug. 1, 2014

(65) Prior Publication Data

US 2015/0168788 A1 Jun. 18, 2015

(30) Foreign Application Priority Data

Dec. 12, 2013 (KR) ........................ 10-2013-0154947

(51) Int. Cl.
| | |
|---|---|
| *G09G 1/00* | (2006.01) |
| *G02F 1/1343* | (2006.01) |
| *G06F 3/041* | (2006.01) |
| *H01L 27/32* | (2006.01) |
| *G02F 1/1333* | (2006.01) |
| *G02F 1/1368* | (2006.01) |
| *G02F 1/1339* | (2006.01) |
| *G02F 1/1362* | (2006.01) |
| *H01L 51/52* | (2006.01) |

(52) U.S. Cl.
CPC ........ *G02F 1/134309* (2013.01); *G02F 1/1339* (2013.01); *G02F 1/1368* (2013.01); *G02F 1/13338* (2013.01); *G02F 1/136213* (2013.01); *G06F 3/0412* (2013.01); *H01L 27/323* (2013.01); *H01L 51/5243* (2013.01); *H01L 51/5246* (2013.01); *G02F 2001/134372* (2013.01); *G02F 2202/16* (2013.01)

(58) Field of Classification Search
CPC ... G06F 3/0416; G02F 1/1339; G02F 3/0412; G02F 1/13338; G02F 1/1368
See application file for complete search history.

(56) References Cited

U.S. PATENT DOCUMENTS

| | | | |
|---|---|---|---|
| 7,663,607 B2 | 2/2010 | Hotelling et al. | |
| 7,714,974 B2 | 5/2010 | Lee et al. | |
| 2006/0097991 A1* | 5/2006 | Hotelling | G06F 3/0416 345/173 |
| 2007/0139600 A1* | 6/2007 | Lee | G02F 1/1339 349/153 |
| 2012/0146493 A1 | 6/2012 | Ra | |

FOREIGN PATENT DOCUMENTS

| | | |
|---|---|---|
| JP | 3502833 B2 | 12/2003 |
| JP | 2004-061548 A | 2/2004 |

(Continued)

*Primary Examiner* — Michael Faragalla
(74) *Attorney, Agent, or Firm* — Knobbe, Martens, Olson & Bear, LLP

(57) ABSTRACT

A display device is disclosed. In one aspect, the display device includes a first panel, a second panel facing the first panel, and a sealant configured to seal together the first and second panels. The first panel includes a first substrate including a display area and a peripheral area surrounding the display area, a thin film display layer formed in the display area of the first substrate, and a first lower gate driving circuit formed in the peripheral area of the first substrate. The second panel includes a second substrate including a display area and a peripheral area surrounding the display area, a contact sensing layer formed in the display area of the second panel, and a first upper gate driving circuit formed in the peripheral area of the second substrate. The sealant at least partially overlaps the first lower and upper gate driving circuits.

20 Claims, 11 Drawing Sheets

(56) References Cited

FOREIGN PATENT DOCUMENTS

| JP | 2004-253303 A | 9/2004 |
| JP | 2009-244958 A | 10/2009 |
| JP | 2011-070092 A | 4/2011 |
| KR | 10-2011-0044670 A | 4/2011 |

* cited by examiner

DISPLAY DEVICE

CROSS-REFERENCE TO RELATED APPLICATION

This application claims priority to and the benefit of Korean Patent Application No. 10-2013-0154947 filed in the Korean Intellectual Property Office on Dec. 12, 2013, the entire contents of which are incorporated herein by reference.

BACKGROUND

1. Field

The described technology generally relates to a display device.

2. Description of the Related Technology

Display devices such as liquid crystal displays (LCDs), organic light-emitting diode (OLED) displays, and electrophoretic displays (EPDs) include a pair of field generating electrodes and an electro-optical active layer. For example, OLED displays include an organic light-emitting layer as the electro-optical active layer. OLED displays further include a display substrate including a display area for displaying images, a peripheral area, and an encapsulation substrate encapsulating the display substrate.

Display devices can also include a touch sensor for receiving touch input from a user. The touch sensor is used to determine whether an object approaches or contacts the screen and to generate contact information about the contact position, etc., by detecting a change in a property of the touch sensor. Touch sensors can sense changes in various properties such as pressure, charge, and light which are applied to a screen when a user approaches or contacts the screen with a finger, a touch pen, etc., to input characters or draw pictures. The display device can receive an image signal to display an image based on the contact information. Touch sensors are classified based on the properties measured, such as resistance, capacitance, electro-magnetic (EM) waves, etc.

SUMMARY OF CERTAIN INVENTIVE ASPECTS

One inventive aspect is a display device having a peripheral area with a reduced size without a corresponding size reduction in a display area.

Another aspect is display device including a first panel, a second panel facing the first panel, and a sealant configured to seal together the first and second panels. The first panel includes a first substrate including a display area and a peripheral area surrounding the display area, a thin film display layer formed in the display area of the first substrate, and a first lower gate driving circuit formed in the peripheral area of the first substrate, wherein the first lower gate driving circuit is closer to the sealant that the thin film display layer. The second panel includes a second substrate including a display area and a peripheral area surrounding the display area, a contact sensing layer formed in the display area of the second panel, and a first upper gate driving circuit formed in the peripheral area of the second substrate, wherein the first upper gate driving circuit is closer to the sealant than the contact sensing layer. The sealant at least partially overlaps the first lower and upper gate driving circuits and includes a plurality of conductive balls electrically connecting the first lower and upper gate driving circuits.

The first panel may further include a first lower contact portion formed of a conductive material and electrically connected to the first lower gate driving circuit.

The second panel may further include a first upper contact portion formed of the conductive material and electrically connected to the first upper gate driving circuit.

The sealant at least partially may overlap the first lower and upper contact portions and the first lower and upper contact portions may be electrically connected to each other via the conductive balls.

The first panel may further include a second lower gate driving circuit formed in the peripheral area of the first substrate, wherein the first and second lower gate driving circuits are formed on opposing sides of the thin film display layer and a second lower contact portion formed of the conductive material and electrically connected to the second lower gate driving circuit.

The second panel may further include a second upper gate driving circuit formed in the peripheral area of the second substrate and wherein the first and second upper gate driving circuits are formed on opposing sides of the contact sensing layer.

The second panel may further include a second contact portion formed of the conductive material and electrically connected to the second gate driving circuit.

The sealant at least partially may overlap the second lower and upper contact portions and the second lower and upper contact portions may be electrically connected to each other via the conductive balls.

The thin film display layer may include a plurality of pixels and each of the pixels may include an OLED.

The first and second lower gate driving circuits may be configured to apply gate signals to the thin film display layer, the first upper gate driving circuit may be configured to apply a light emitting signal to the thin film display layer, and the second upper gate driving circuit may be configured to apply a gate initialization signal to the thin film display layer.

The display device may further comprise a liquid crystal layer interposed between the first and second panels.

The thin film display layer may include a pixel electrode and a common electrode configured to apply an electric field to the liquid crystal layer.

Each of the first and second lower gate driving circuits may include a plurality of thin film transistors and each of the first and second upper gate driving circuits may include a plurality of capacitors.

The contact sensing layer may include a plurality of first touch electrodes and a plurality of second touch electrodes which are spaced apart from the first touch electrodes and are formed on the same layer as the first touch electrodes.

The first and second touch electrodes may be alternately arranged and they do not overlap each other, the first touch electrodes may be electrically connected to each other via a plurality of first connection portions, and the second touch electrodes may be electrically connected to each other via a plurality of second connection portions.

Another aspect is a display device including a first panel, a second panel facing the first panel, and a sealant configured to seal together the first and second panels, wherein the first panel includes a first substrate including a display area and a peripheral area surrounding the display area, a thin film display layer formed in the display area of the first substrate, and a first lower gate driving circuit formed in the peripheral area of the first substrate, wherein the first lower gate driving circuit is closer to the sealant that the thin film display layer, wherein the second panel includes a second substrate including a display area and a peripheral area surrounding the display area, a contact sensing layer formed in the display area of the second panel, and a first upper gate driving circuit formed in the peripheral area of the second substrate, wherein the first upper gate driving circuit is closer to the sealant than the contact sensing layer, and wherein the sealant at least partially overlaps the first lower and upper gate driving circuits and includes a plurality of conductive balls electrically connecting the first lower and upper gate driving circuits.

The first panel further includes a first lower contact portion formed of a conductive material and electrically connected to the first lower gate driving circuit. The second panel further includes a first upper contact portion formed of the conductive material and electrically connected to the first upper gate driving circuit. The sealant at least partially overlaps the first lower and upper contact portions and the first lower and upper contact portions are electrically connected to each other via the conductive balls. The first panel further includes a second lower gate driving circuit formed in the peripheral area of the first substrate, wherein the first and second lower gate driving circuits are formed on opposing sides of the thin film display layer, and a second lower contact portion formed of the conductive material and electrically connected to the second lower gate driving circuit. The second panel further includes a second upper gate driving circuit formed in the peripheral area of the second substrate and the first and second upper gate driving circuits are formed on opposing sides of the contact sensing layer.

The second panel further includes a second contact portion formed of the conductive material and electrically connected to the second gate driving circuit. The sealant at least partially overlaps the second lower and upper contact portions and the second lower and upper contact portions are electrically connected to each other via the conductive balls. The thin film display layer includes a plurality of pixels and each of the pixels includes an organic light-emitting diode (OLED). The first and second lower gate driving circuits are configured to apply gate signals to the thin film display layer, wherein the first upper gate driving circuit is configured to apply a light-emitting signal to the thin film display layer and wherein the second upper gate driving circuit is configured to apply a gate initialization signal to the thin film display layer. The display device further includes a liquid crystal layer interposed between the first and second panels. The thin film display layer includes a pixel electrode and a common electrode configured to apply an electric field to the liquid crystal layer. Each of the first and second lower gate driving circuits include a plurality of thin film transistors (TFTs) and each of the first and second upper gate driving circuits include a plurality of capacitors. The contact sensing layer includes a plurality of first touch electrodes and a plurality of second touch electrodes which are i) spaced apart from the first touch electrodes and ii) formed on the same layer as the first touch electrodes. The first and second touch electrodes are alternately arranged and do not overlap each other, wherein the first touch electrodes are electrically connected to each other via a plurality of first connection portions and wherein the second touch electrodes are electrically connected to each other via a plurality of second connection portions.

Another aspect is a display device including first and second substrates each including a display area and a peripheral area surrounding the display area, a plurality of pixels formed in the display area of the first substrate, first and second lower gate driving circuits configured to drive the pixels and formed in the peripheral area of the first substrate, and first and second upper gate driving circuits configured to drive the pixels and formed in the peripheral area of the second substrate, wherein the first and second upper gate driving circuits are respectively electrically connected to the first and second lower gate driving circuits.

The display device further includes a sealant formed over and at least partially overlapping the first and second lower gate driving circuits in the peripheral area and at least partially overlapping the sealant, wherein the sealant is interposed between and substantially seals the first and second substrates and wherein the sealant includes a plurality of conductive balls electrically connecting the first lower gate driving circuit to the first upper gate driving circuit and the second lower gate driving circuit to the second upper gate driving circuit. The display device further includes first and second lower contact portions respectively electrically connected to the first and second lower driving circuits and first and second upper contact portions respectively electrically connected to the first and second upper driving circuits. The first lower and upper contact portions are electrically connected via the conductive balls and the second lower and upper contact portions are electrically connected via the conductive balls. The first and second lower gate driving circuits are configured to apply gate signals to the pixels, wherein the first upper gate driving circuit is configured to apply a light-emitting signal to the pixels, and wherein the second upper gate driving circuit is configured to apply a gate initialization signal to the pixels. The display device further includes a contact sensing layer formed under the second substrate and interposed between the first and second upper gate driving circuits, wherein the contact sensing layer is electrically insulated from the first and second upper gate driving circuits.

According to at least one embodiment, the size of the peripheral area is reduced by separately formed the gate driving circuits on two substrates and electrically connecting them via the sealant containing the conductive balls.

Accordingly, the display device can have a reduced size without a reduction in size of the display area.

In addition, the thickness of the substrate may be reduced by etching an outer side of the substrate opposite to a contact sensing layer formed on an inner side of the substrate.

DETAILED DESCRIPTION OF CERTAIN INVENTIVE EMBODIMENTS

Figure 1:
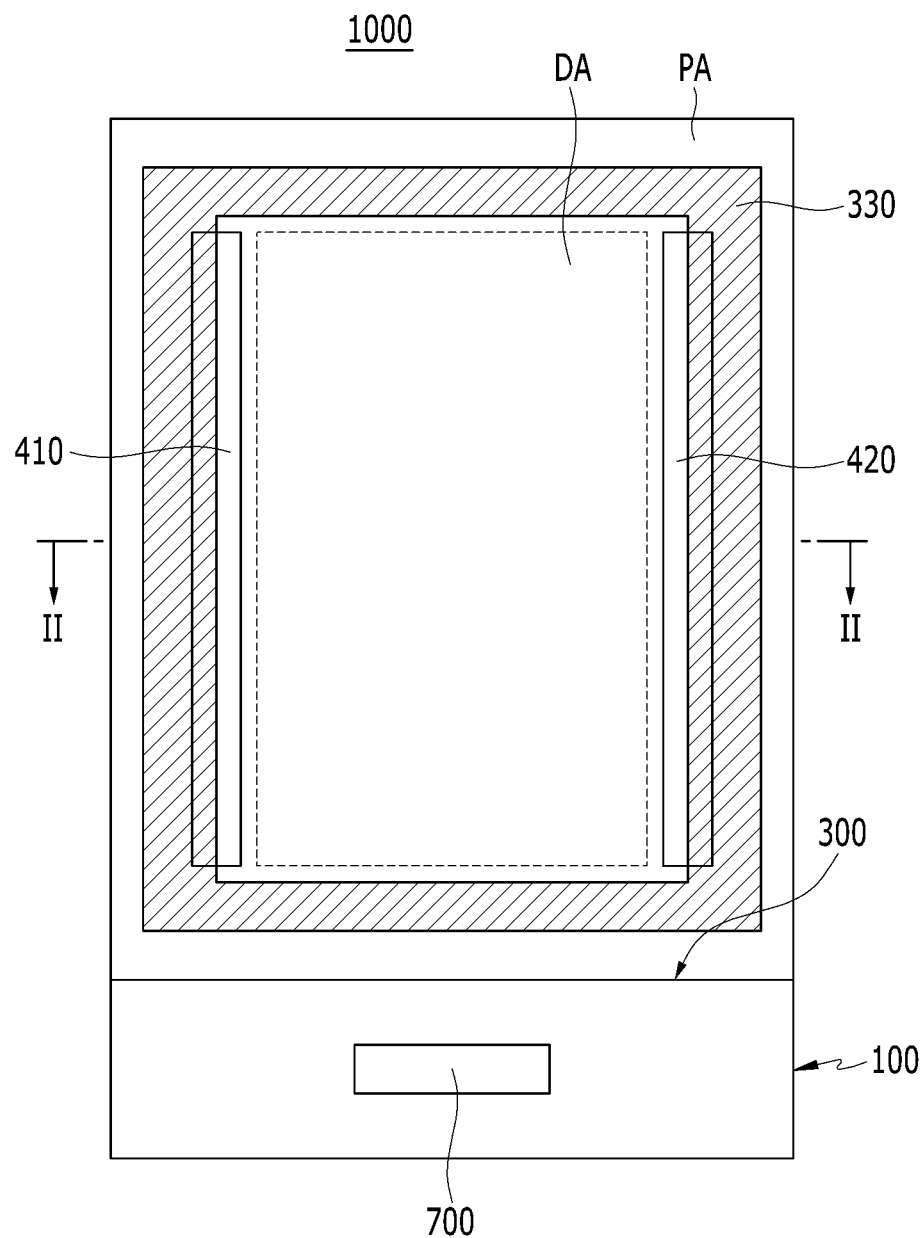
FIG. 1 is a top plan view illustrating a display device according to an exemplary embodiment.

Display devices include a driving circuit for applying driving signals to an electro-optical active layer. These circuits can be formed on the same substrate as the electro-optical active layer and are typically formed in a peripheral area. Reducing the size or width of the peripheral area is limited by the space occupied by the driving circuit.

The described technology will be described more fully hereinafter with reference to the accompanying drawings, in which exemplary embodiments of the described technology are shown. As those skilled in the art would realize, the described embodiments may be modified in various different ways, all without departing from the spirit or scope of the described technology. On the contrary, the exemplary embodiments introduced herein are provided to make disclosed contents thorough and complete and sufficiently transfer the spirit of the described technology to those skilled in the art. The term "substantially" as used in this disclosure means completely, almost completely, or to any significant degree.

In the drawings, the thicknesses of layers and regions may be exaggerated for clarity. In addition, when a layer is described as formed on another layer or on a substrate, this means that the layer may be directly formed on the other layer or substrate, or a third layer may be interposed between the layer and the other layer or the substrate. Like reference numerals designate like elements throughout the specification.

A display device according to an exemplary embodiment will be described with reference to FIGS. 1 to 6.

Figure 2:
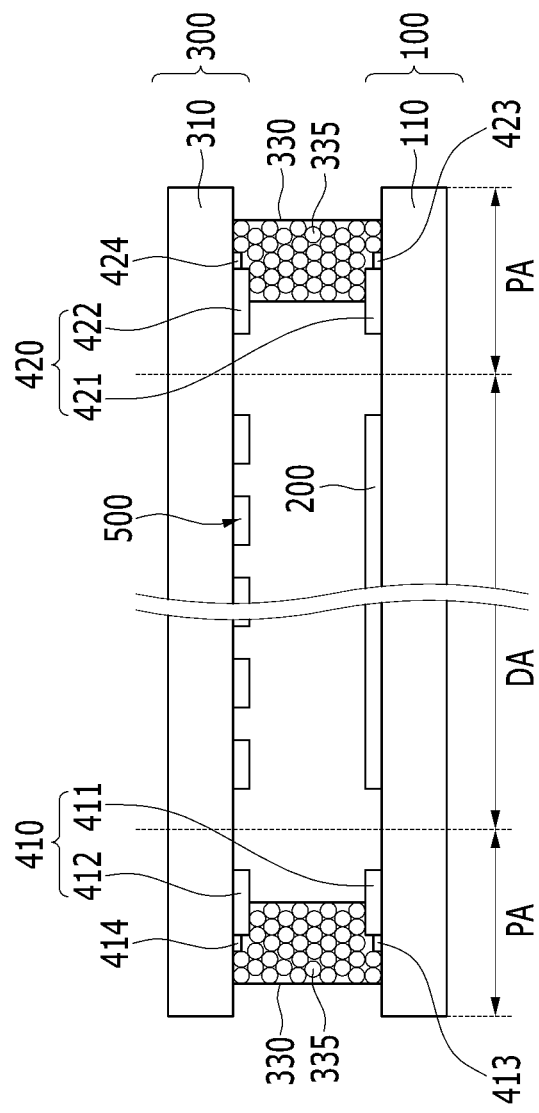
FIG. 2 is a cross-sectional view of FIG. 1 taken along the line II-II.

Referring to FIGS. 1 and 2, the display device 1000 includes a first panel 100 and a second panel 300 facing the first panel 100. The first panel 100 has a larger size than the second panel 300. The display device 1000 includes a display area DA for displaying images and a peripheral area PA surrounding the display area DA.

The first and second panels 100 and 300 are bonded to each other via a sealant 330. The sealant 330 substantially seals the first and second panels 100 and 300 to each other. The sealant 330 is formed in the peripheral area PA and surrounds the display area DA. A first gate driving circuit 410, a second gate driving circuit 420, and a data driving circuit 700 are formed in the peripheral area PA.

The first and second gate driving circuits 410 and 420 apply gate signals and a light emitting signal to the display area DA and are respectively formed at left and right sides of the display area DA. The data driving circuit 700 applies a data signal to the display area DA and is formed at a lower part of the display area DA. In other embodiments, the data driving circuit 700 is formed at an upper part of the display area DA.

The first and second gate driving circuits 410 and 420 are formed to partially overlap the sealant 330. In some embodiments, the display device 1000 further includes a window formed over the first panel 100 to protect the first and second panels 100 and 300.

The detailed structure of the display device 1000 will now be described.

The first panel 100 includes a first substrate 110 formed of a transparent material such as glass or plastic and a thin film display layer 200 formed over the first substrate 110. The thin film display layer 200 is formed in the display area DA on an inner side of the first substrate 110, that is, on a side facing the second panel 300. The thin film display layer 200 includes a plurality of pixels.

Each pixel includes a switching thin film transistor T1, a driving thin film transistor T2, a storage capacitor Cst, and an organic light-emitting diode (OLED) 70 to be described later. Each pixel is connected to the first gate driving circuit 410 or the second gate driving circuit 420.

The first panel 100 further includes a first lower gate driving circuit 411, a second lower gate driving circuit 421, a first lower contact portion 413 connected to the first lower gate driving circuit 411, and a second lower contact portion 423 connected to the second lower gate driving circuit 421. The first and second lower contact portions 413 and 423 are formed of a conductive material. The first and second lower gate driving circuits 411 and 421 and the first and second lower contact portions 413 and 423 are formed on the inner side of the first substrate 110, that is, on the side facing the second panel 300. The first and second lower gate driving circuits 411 and 421 are electrically connected to each pixel.

The second panel 300 includes a second substrate 310 formed of a transparent material such as glass or plastic, and contact sensing layers 500. The contact sensing layers 500 are formed on an inner side of the second substrate 310, that is, on a side facing the first panel 100. Thus, the contact sensing layers 500 face the thin film display layer 200. The contact sensing layers 500 detects a touch input. In some embodiments, the contact sensing layers 500 detect touch input when an object approaches or actually contacts the second panel 300.

As used herein, the touch input refers not only when an external object directly contacts the second panel 300, but also when the external object approaches the second panel 300 or hovers over the second panel 300.

The second panel 300 further includes a first upper gate driving circuit 412, a second upper gate driving circuit 422, a first upper contact portion 414 connected to the first upper gate driving circuit 412, and a second upper contact portion 424 connected to the second upper gate driving circuit 422. All of the abovementioned elements are formed in the peripheral area PA.

The first and second upper contact portions 414 and 424 are formed of a conductive material. The first and second upper gate driving circuits 412 and 422 and the first and second upper contact portions 414 and 424 are formed on the inner side of the second substrate 310, that is, on the side facing the first panel 100. The first lower gate driving circuit 411 faces the first upper gate driving circuit 412, and the second lower gate driving circuit 421 faces the second upper gate driving circuit 422. Similarly, the first lower contact portion 413 faces the first upper contact portion 414, and the second lower contact portion 423 faces the second upper contact portion 424.

The sealant 330 bonds the first and second panels 100 and 300 to each other and partially contacts each of the first lower and upper gate driving circuits 411 and 412 as well as the second lower and upper gate driving circuits 421 and 422.

A plurality of conductive balls 335 formed of a conductive material are formed inside the sealant 330. The plurality of conductive balls 335 electrically contact each other. The conductive balls 335 further contact the first lower and upper contact portions 413 and 414 at the location where the sealant 330 contacts the first lower and upper gate driving circuits 411 and 412. Thus, the first lower and upper contact portions 413 and 414 are electrically connected to each other through the conductive balls 335.

Accordingly, the first lower and upper gate driving circuits 411 and 412 are electrically connected to each other. The first lower and upper gate driving circuits 411 and 412 form the first gate driving circuit 410.

In addition, conductive balls 335 contact the second lower and upper contact portions 423 and 424 at the location where the sealant 330 contacts the second lower and upper gate driving circuits 421 and 422. Thus, the second lower and upper contact portions 423 and 424 are electrically connected to each other through the conductive balls 335.

Accordingly, the second lower and upper gate driving circuits 412 and 422 are electrically connected to each other. The second lower and upper gate driving circuits 412 and 422 form the second gate driving circuit 420.

The first upper gate driving circuit 412 applies a light emitting signal to the display area DA and the first lower gate driving circuit 411 applies a gate signal to the display area DA. The second upper gate driving circuit 422 applies a gate initialization signal to the display area DA and the second lower gate driving circuit 421 applies a gate signal to the display area DA.

As described above, the first gate driving circuit 410 includes the first lower gate driving circuit 411 formed on the first substrate 110 and the first upper gate driving circuit 412 formed on the second substrate 310. The second gate driving circuit 420 includes the second lower gate driving circuit 421 formed on the first substrate 110 and the second upper gate driving circuit 422 formed on the second substrate 310.

Thus, the peripheral area PA of the display device 1000 has a decreased width compared to a typical display device having both the first and second gate driving circuits 410 and 420 on a single substrate. Accordingly, the display device 1000 has a reduced size without reducing the size of the display area DA.

Moreover, as the contact sensing layer 500 is formed on the inner side of the second substrate 310, the second substrate 310 of the display device 1000 has a decreased width by etching an outer side of the second substrate 310.

The contact sensing layer 500 will now be described with reference to FIGS. 3 to 5.

Figure 3:
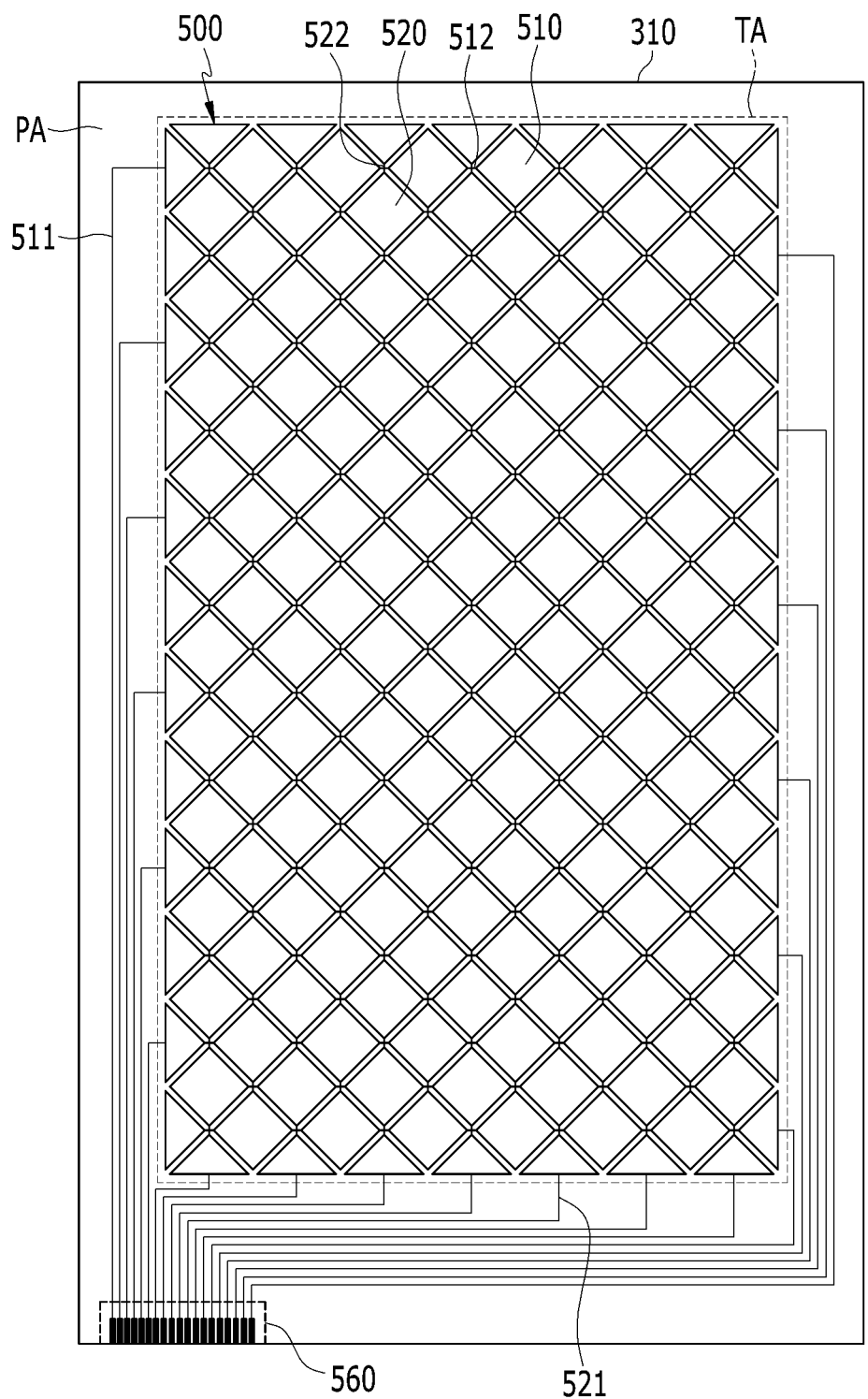
FIG. 3 is a top plan view showing a contact sensing layer of the display device of FIG. 1.

Referring to FIG. 3, as described above, the contact sensing layer 500 is formed on the inner side of the second substrate 310. The contact sensing layer 500 is formed in a touch active area TA where the touch input can be detected. The touch active area TA can be the entire display area DA or a part of the peripheral area PA can be utilized as the touch active area TA. Alternatively, only a portion of the display area DA is used in forming the touch active area TA.

According to the embodiment, the contact sensing layer 500 detects the touch input by using various methods. For example, the touch sensing can be classified based on the sensed property such as resistance, capacitance, electro-magnetic (EM) waves, etc.

A capacitive touch sensor will be described as an exemplary embodiment.

The contact sensing layer 500 includes a plurality of touch electrodes and the touch electrodes include a plurality of first touch electrodes 510 and a plurality of second touch electrodes 520. The first and second touch electrodes 510 and 520 are separated from each other. The first and second touch electrodes 510 and 520 are alternately arranged such that they do not overlap each other in the touch active area TA.

The first touch electrodes 510 are arranged in a column direction and a row direction and the second touch electrodes 520 are arranged a column direction and a row direction. The first and second touch electrodes 510 and 520 are formed on the same layer. The first and second touch electrodes 510 and 520 are not limited to the above description and may be formed on different layers.

In the FIG. 3 embodiment, the first and second touch electrodes 510 and 520 each have a substantially quadrangular shape, but they are not limited thereto. In other embodiments, the first and second touch electrodes 510 and 520 have various shapes such as a protrusion portion in order to improve the sensitivity of the touch sensing layer 500.

The first touch electrodes 510 formed in the same row or the same column are electrically connected to each other or separated from each other inside or outside the touch active area TA. Similarly, the second touch electrodes 520 formed in the same column or in the same are electrically connected to each other or separated from each other inside or outside the touch active area TA.

As illustrated in FIG. 3, when the first touch electrodes 510 formed in the same row are electrically connected to each other inside the touch active area TA, the second touch electrodes 520 formed in the same column are electrically connected to each other inside the touch active area TA. In more detail, the first touch electrodes 510 formed in each row are electrically connected to each other through a plurality of first connection portions 512 and the second touch electrodes 520 formed in each column are electrically connected to each other through a plurality of second connection portions 522.

Figure 4:
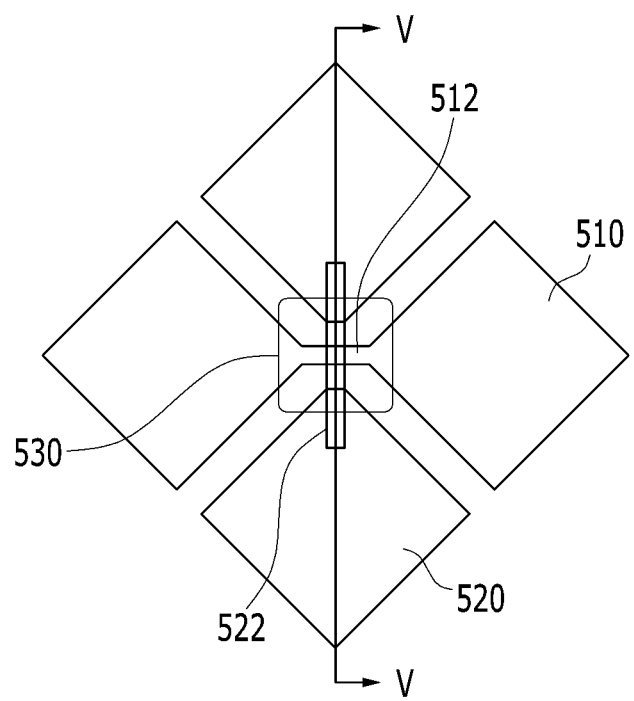
FIG. 4 is a partial enlarged view of the contact sensing layer illustrated in FIG. 3.
Figure 5:
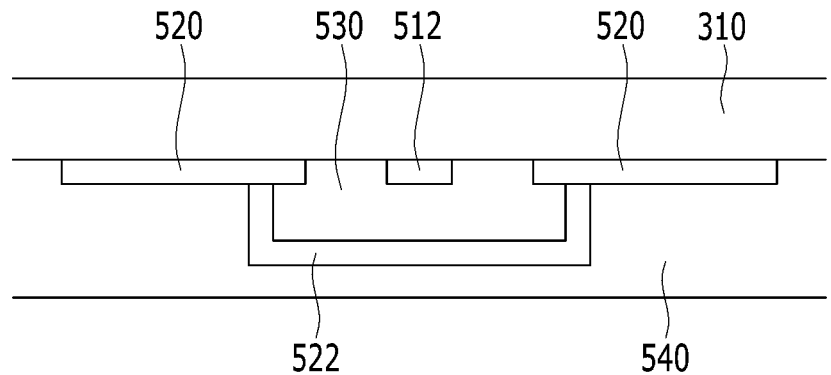
FIG. 5 is a cross-sectional view of FIG. 4 taken along the line V-V.

Referring to FIGS. 4 and 5, the first connection portion 512 electrically connecting the neighboring first touch electrodes 510 is formed on the same layer as the first touch electrodes 510. The first connection portion 512 is formed of the same material as the first touch electrodes 510. That is, the first touch electrodes 510 and the first connection portions 412 are integrally formed and are simultaneously patterned.

The second connection portion 522 electrically connecting the neighboring second touch electrodes 520 is formed on a different layer from the second touch electrodes 520. That is, the second touch electrodes 520 and the second connection portions 522 are separated from each other and are separately patterned. The second touch electrodes 520 and the second connection portions 522 directly contact to be electrically connected to each other.

A first insulation layer 530 is formed between the first and second connection portions 512 and 522 to electrically insulate them. As illustrated in the embodiment of FIGS. 4 and 5, the insulation layer 530 is formed as a plurality of separate island-shaped insulators arranged at the intersections between of the first and second connection portions 512 and 522.

The first insulation layer 530 exposes at least a portion of the second touch electrodes 520 such that the second connection portion 522 is electrically connected to the second touch electrodes 520. The first insulation layer 530 may be formed to have rounded edges or a polygonal shape and may be formed at least partially of a silicon oxide ($SiO_x$), a silicon nitride ($SiN_x$), a silicon oxynitride ($SiO_xN_y$), or a combination thereof.

A second insulation layer 540 is formed on the first and second touch electrodes 510 and 520 and the second connection portions 522. The second insulation layer 540 is formed on substantially the entire touch active area TA and may be formed at least partially of a silicon oxide ($SiO_x$), a silicon nitride ($SiN_x$), a silicon oxynitride ($SiO_xN_y$), or a combination thereof.

In other embodiments, in contrast to the embodiment of FIGS. 4 and 5, the second connection portions 522 electrically connecting the neighboring second touch electrodes 520 are formed on the same layer as the first touch electrodes 510 and are integrally formed therewith. In these embodiments, the first connection portions 512 electrically connecting the neighboring first touch electrodes 510 are formed on a different layer from the first touch electrodes 510.

Referring to FIG. 3 again, the first touch electrodes 510 electrically connected to each other in each row are electrically connected to a touch sensor controller (not shown) through first touch wires 511. The second touch electrodes 520 electrically connected to each other in each column are electrically connected to the touch sensor controller (not shown) through second touch wires 521. The first and second touch wires 511 and 521 may be formed in the peripheral area PA as illustrated in FIG. 3, or may be formed in the touch active area TA in other embodiments.

End portions of the first and second touch wires 511 and 521 form a pad portion 560 in the peripheral area PA of the second substrate 310. The first and second touch electrodes 510 and 520 have a transmittance exceeding a predetermined level to transmit light from the thin film display layer 200. For example, the first and second touch electrodes 510 and 520 may be made of a thin metal layer such as indium tin oxide (ITO), indium zinc oxide (IZO), or silver nanowire (AgNw), or a transparent conductive material such as metal mesh or carbon nanotubes (CNT), but they are not limited thereto.

The first and second touch wires 511 and 521 may contain a transparent conductive material forming the first and second touch electrodes 510 and 520, or a low resistance material such as molybdenum (Mo), silver (Ag), titanium (Ti), copper (Cu), aluminum (Ti), or molybdenum/aluminum/molybdenum (Mo/Al/Mo).

The first and second touch electrodes 510 and 520 neighboring each other form a mutual sensing capacitor to function as a touch sensor. The mutual sensing capacitor receives a sensing input signal from one of the first and second touch electrodes 510 and 520 and outputs a change in stored charge through the other touch electrode as a sensing output signal.

In other embodiment, in contrast to the embodiment of FIGS. 3 to 5, each of the first and second touch electrodes 510 and 520 are separated from each other and are respectively electrically connected to the touch sensor controller through separate touch wires (not shown). In these embodiments, each of the touch electrodes forms a self-sensing capacitor as a touch sensor. The self-sensing capacitor receives the sensing input signal to store a predetermined electric charge. If there is a touch input from an external object such as a finger, the electric charge is altered to output the sensing output signal different from the sensing input signal.

The thin film display layer 200 according to an exemplary embodiment will now be described with reference to FIGS. 6 and 7.

As described above, the thin film display layer 200 includes a plurality of pixels.

Figure 6:
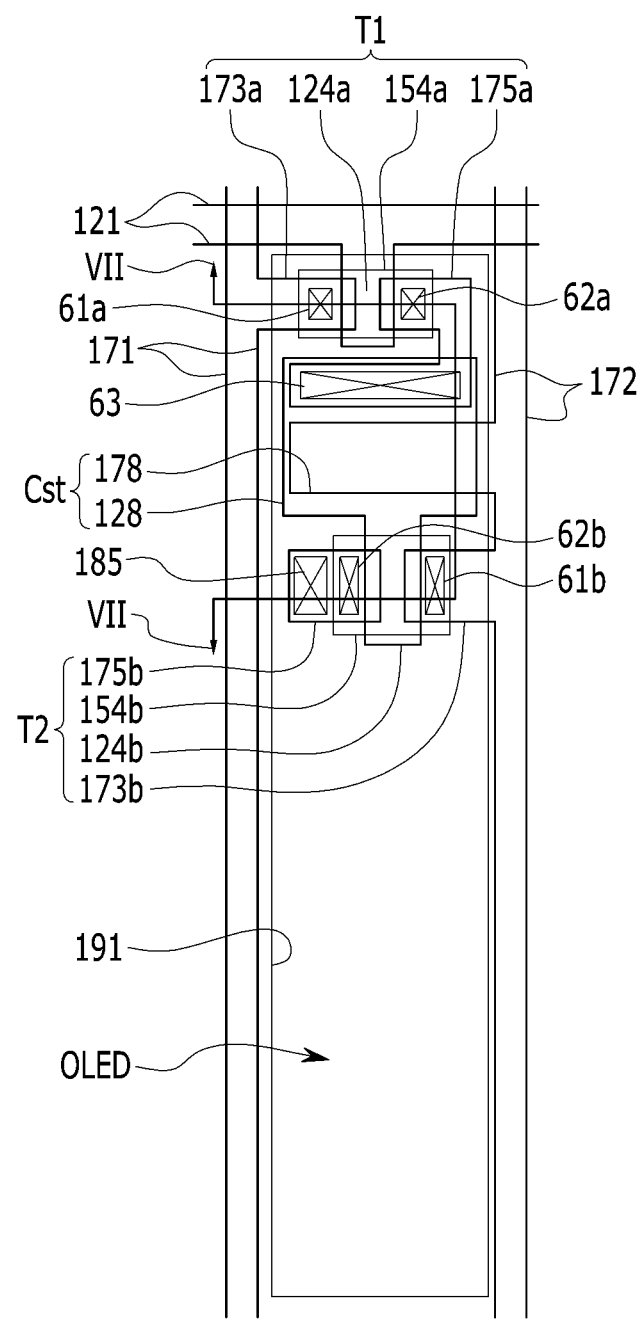
FIG. 6 is a layout view of a pixel of the display device according to an exemplary embodiment.
Figure 7:
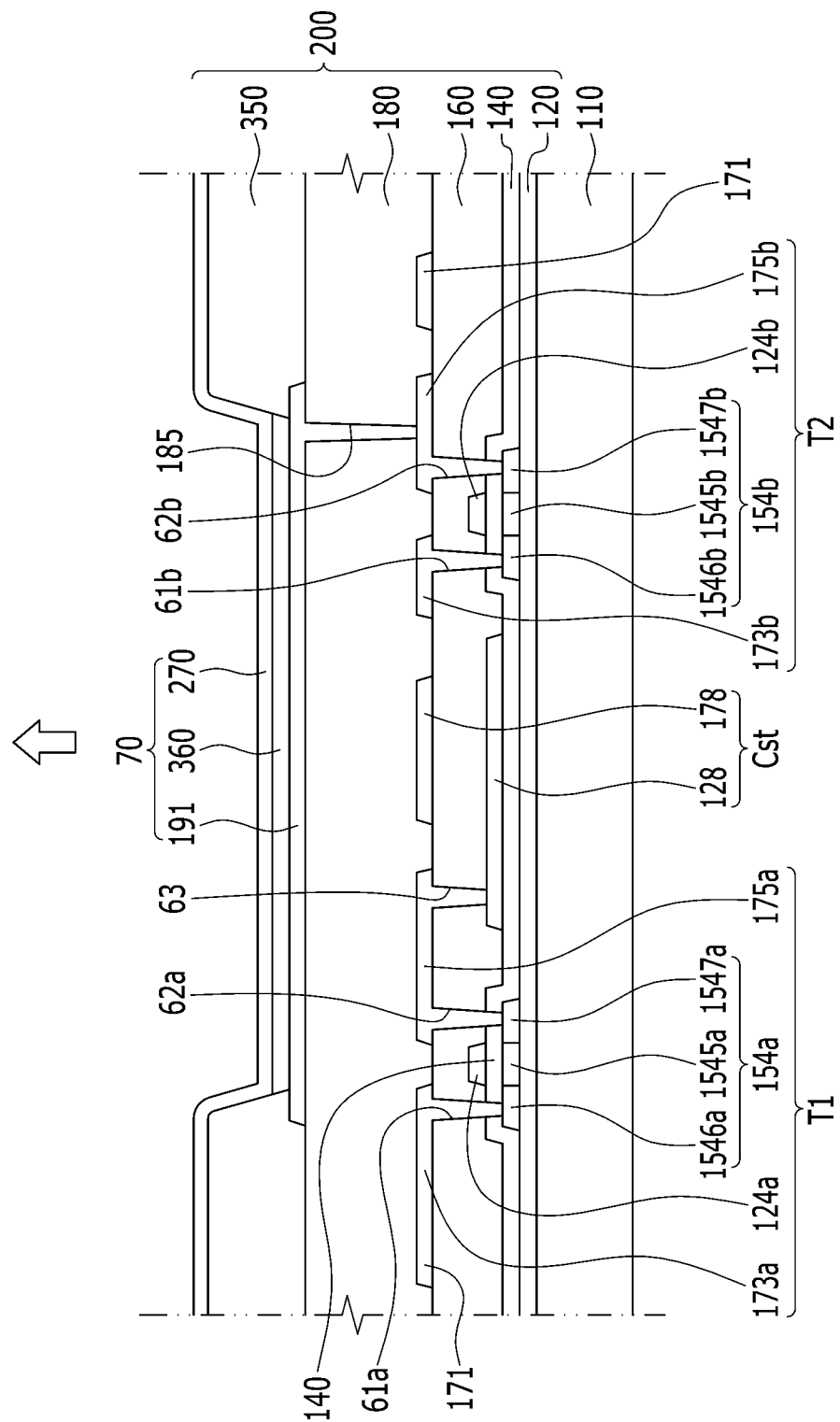
FIG. 7 is a cross-sectional view of FIG. 6 taken along the line VII-VII.

Referring to FIGS. 6 and 7, the thin film display layer 200 includes a buffer layer 120, switching and driving semiconductor layers 154*a* and 154*b*, a gate insulation layer 140, gate lines 121, a first storage capacitor plate 128, an interlayer insulating layer 160, data lines 171, driving voltage lines 172, a switching drain electrode 175*a*, a driving drain electrode 175*b*, and a passivation layer 180.

The buffer layer 120 is formed on the first substrate 110, and may have a single layer structure including a silicon nitride ($SiN_x$) or a double-layered structure in which a silicon nitride ($SiN_x$) and a silicon oxide $SiO_2$ are laminated. The buffer layer 120 serves to planarize a surface of the substrate 110 while substantially preventing unnecessary materials such as impurities or moisture from permeating therethrough.

The switching semiconductor layer 154*a* and the driving semiconductor layer 154*b* are formed on the buffer layer 120 and are spaced apart from each other. The switching and driving semiconductor layers 154*a* and 154*b* can be formed of polycrystalline silicon and include channel regions 1545*a* and 1545*b*, source regions 1546*a* and 1546*b*, and drain regions 1547*a* and 1547*b*. The source regions 1546*a* and 1546*b* and the drain regions 1547*a* and 1547*b* are respectively formed on opposing sides of the channel regions 1545*a* and 1545*b*. The channel regions 1545*a* and 1545*b* can be formed of polysilicon in which no impurities are doped, that is, an intrinsic semiconductor, and the source regions 1546*a* and 1546*b* and the drain regions 1547*a* and 1547*b* can be formed of polysilicon in which conductive impurities are doped, that is, a doped semiconductor.

The gate insulation layer 140 is formed on the channel regions 1545*a* and 1545*b* of the switching semiconductor layer 154*a* and the driving semiconductor layer 154*b*. The gate insulation layer 140 may be a single layer or multiple layers containing a silicon nitride and/or a silicon oxide.

The gate lines 121 and the first storage capacitor 128 are formed on the gate insulation layer 140.

The gate lines 121 extend in a horizontal direction to transmit gate signals and include a switching gate electrode 124*a* protruding towards the switching semiconductor layer 154*a* from the gate lines 121. The gate lines 121 are connected to the first and second gate driving circuits 410 and 420.

The first storage capacitor plate 128 includes a driving gate electrode 124*b* protruding therefrom towards the driving semiconductor layer 154*b*. The switching gate electrode 124*a* and the driving gate electrode 124*b* respectively overlap the channel regions 1545*a* and 1545*b*.

The interlayer insulating layer 160 is formed on the gate lines 121, the first storage capacitor plate 128, and the gate insulation layer 140. A switching source contact hole 61*a* and a switching drain contact hole 62*a* respectively exposing the source region 1546*a* and the drain region 1547*a* of the switching semiconductor layer 154*a* are formed in the interlayer insulating layer 160. A driving source contact hole 61*b* and a driving drain contact hole 62*b* respectively exposing the source region 1546*b* and the drain region 1547*b* of the driving semiconductor layer 154*b* are formed in the interlayer insulating layer 160.

The data lines 171, the driving voltage lines 172, the switching drain electrode 175*a*, and the driving drain electrode 175*b* are formed on the interlayer insulating layer 160. The data lines 171 transmit a data signal, extend in a direction crossing the gate lines 121, and include a switching source electrode 173*a* protruding towards the switching semiconductor layer 154*a* from the data lines 171.

The driving voltage lines 172 transmits a driving voltage and are separated from the data lines 171 while extending in substantially the same direction as the data lines 171. The driving voltage lines 172 include a driving source electrode 173*b* protruding towards the driving semiconductor layer 154*b* from the driving voltage lines 172 and a second storage capacitor plate 178 protruding from the driving voltage lines 172 to overlap the first storage capacitor plate 128.

Herein, the first storage capacitor plate 128 and the second storage capacitor plate 178 form the storage capacitor Cst with the interlayer insulating layer 160 as a dielectric material therebetween.

The switching drain electrode 175*a* faces the switching source electrode 173*a* and the driving drain electrode 175*b* faces the driving source electrode 173*b*.

The switching source electrode 173*a* and the switching drain electrode 175*a* are respectively connected to the source region 1546*a* and the drain region 1547*a* of the switching semiconductor layer 154*a* through the switching source contact hole 61*a* and the switching drain contact hole 62*a*.

The switching drain electrode 175*a* is elongated to be electrically connected to the first storage capacitor plate 128 and the driving gate electrode 124*b* through a first contact hole 63 formed on the interlayer insulating layer 160.

The driving source electrode 173*b* and the driving drain electrode 175*b* are respectively connected to the source region 1546*b* and the drain region 1547*b* of the driving semiconductor layer 154*b* through the driving source contact hole 61*b* and the driving drain contact hole 62*b*.

The switching semiconductor layer 154a, the switching gate electrode 124a, the switching source electrode 173a, and the switching drain electrode 175a form the switching thin film transistor T1. Similarly, the driving semiconductor layer 154b, the driving gate electrode 124b, the driving source electrode 173b, and the driving drain electrode 175b form the driving thin film transistor T2.

The passivation layer 180 is formed on the data lines 171, the driving voltage lines 172, the switching drain electrode 175a, and the driving drain electrode 175b. A second contact hole 185 exposing the driving drain electrode 175b is formed in the passivation layer 180.

The OLED 70 and a pixel defining layer 350 are disposed on the passivation layer 180. The OLED 70 includes a pixel electrode 191, an organic emission layer 360, and a common electrode 270. The pixel electrode 191 is formed on the passivation layer 180 and electrically connected to the driving drain electrode 175b of the driving thin film transistor T2 through the second contact hole 185 formed in the interlayer insulating layer 160.

The pixel electrode 191 is an anode electrode of the OLED 70. The pixel electrode 191 may be formed of a transparent conductive material such as indium tin oxide (ITO), indium zinc oxide (IZO), zinc oxide (ZnO), or indium oxide ($In_2O_3$), or a reflective metal such as lithium (Li), calcium (Ca), lithium fluoride/calcium (LiF/Ca), lithium fluoride/aluminum (LiF/Al), aluminum (Al), silver (Ag), magnesium (Mg), or gold (Au).

The pixel defining layer 350 is formed on edge portions of the pixel electrode 191 and the passivation layer 180. The pixel defining layer 350 has an opening through which the pixel electrode 191 is exposed. The pixel defining layer 350 may be formed of a polyacryl-based resin, polyimide-based resin, or a combination thereof.

The organic emission layer 360 is formed on the pixel electrode 191 in the opening of the pixel defining layer 350.

The organic emission layer 360 consists of multiple layers including one or more selected from an emission layer, a hole-injection layer (HIL), a hole-transporting layer (HTL), an electron-transporting layer (ETL), and an electron-injection layer (EIL). When the organic emission layer 360 includes all of the above layers, the hole-injection layer is formed on the pixel electrode 191, which is an anode electrode, and the hole-transporting layer, the emission layer, the electron-transporting layer, and the electron-injection layer are sequentially laminated thereon.

The organic emission layer 360 may include a red, green, or blue organic emission layer respectively emitting red, green, or blue light. The red, green, and blue organic emission layers are respectively formed on red, green, and blue pixels to implement a color image.

Alternatively, the red, green, and blue organic emission layers are integrally laminated on the organic emission layer 360 in each of the red, green, and blue pixels and red, green, and blue color filters are respectively formed over each of the pixels to implement a color image.

As an example, a white organic emission layer emitting white light is formed in each of the red, green, and blue pixels red, green, and blue color filters are respectively formed for every pixel to implement a color image.

When the color image is implemented by using the white organic emission layer and the color filters, a deposition mask for depositing the red, green, and blue organic emission layers in the individual pixels, that is, the red, green, and blue pixels is not required.

The white organic emission layer described in another example may be formed as a single organic emission layer and may further include a configuration in which a plurality of organic emission layers are laminated to emit white light. For example, a configuration in which at least one yellow organic emission layer and at least one blue organic emission layer are combined to emit white light, a configuration in which at least one cyan organic emission layer and at least one red organic emission layer are combined to emit white light, and a configuration in which at least one magenta organic emission layer and at least one green organic emission layer are combined to emit white light may be further included.

The common electrode 270 is formed on the pixel defining layer 350 and the organic emission layer 360. The common electrode 270 may be formed at least partially of a transparent conductive material such as indium tin oxide (ITO), indium zinc oxide (IZO), zinc oxide (ZnO), and indium oxide ($In_2O_3$), or a reflective metal such as lithium, calcium, lithium fluoride/calcium, lithium fluoride/aluminum, aluminum, silver, magnesium, gold, or a combination thereof. The common electrode 270 is a cathode electrode of the OLED 70.

Figure 8:
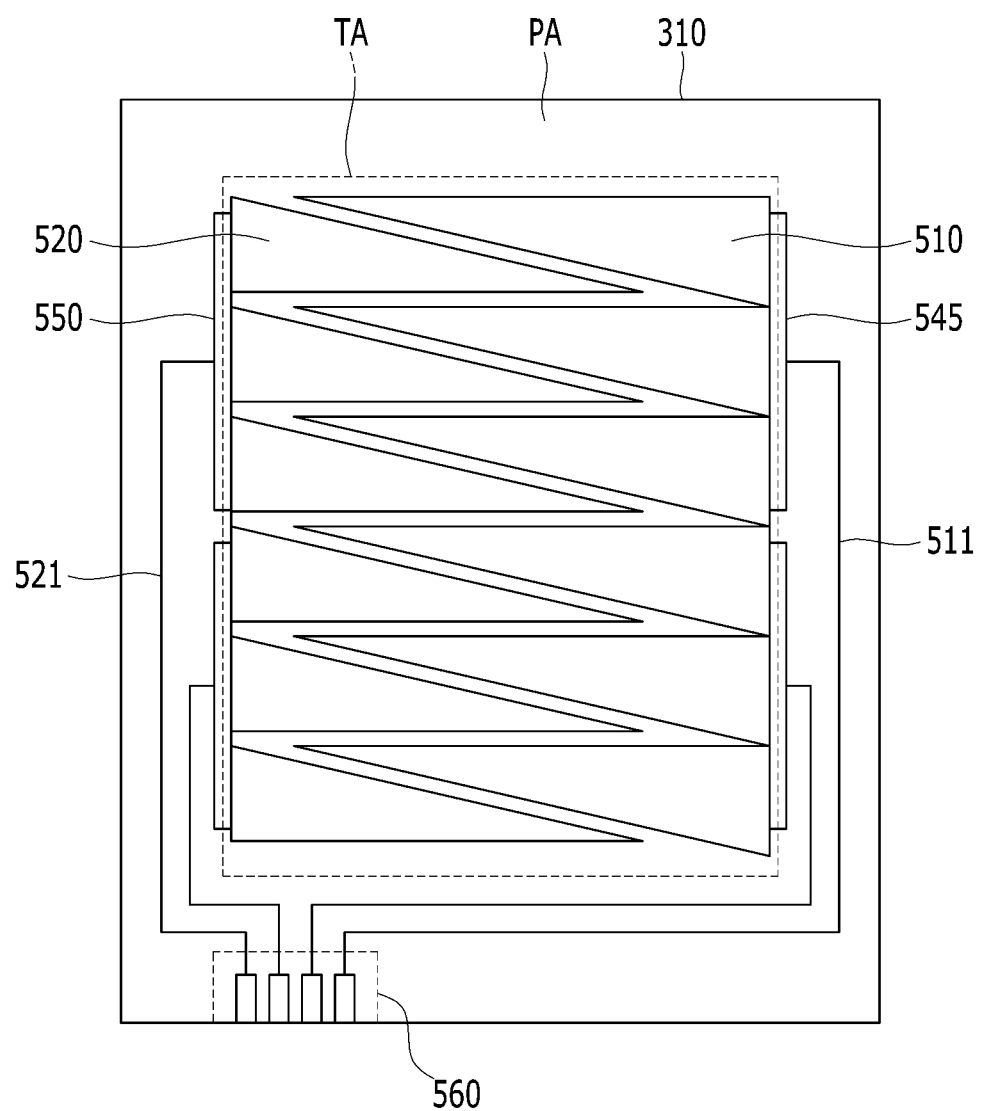
FIG. 8 is a top plan view of a contact sensing layer according to another exemplary embodiment.

Meanwhile, in some embodiments, the contact sensing layer 500 has different shapes. A contact sensing layer 500 according to another exemplary embodiment will be described with reference to FIG. 8. FIG. 8 is a top plan view of the contact sensing layer.

Referring to FIG. 8, the contact sensing layer 500 is formed on an inner side of the second substrate 310. The contact sensing layer 500 is formed inside a touch active area TA where touch input can be detected. The contact sensing layer 500 includes a plurality of touch electrodes and the touch electrodes include a plurality of first and second touch electrodes 510 and 520. The first and second electrodes 510 and 520 are separated from each other.

The first and second touch electrodes 510 and 520 are alternately arranged in the touch active area TA and do not overlap each other. The first touch electrodes 510 are arranged in a row direction and the second touch electrodes 520 are also arranged a row direction.

The first and second touch electrodes 510 and 520 respectively have a substantially triangular shape. The first touch electrodes 510 are electrically connected to each other through a plurality of first touch connection portions 545 and the second touch electrodes 520 are electrically connected to each other through a plurality of second touch connection portions 550.

The first touch connection portions 545 are arranged in a row direction and electrically connect a plurality of first touch electrodes 510. The second touch connection portions 550 are arranged in a row direction and electrically connect a plurality of second touch electrodes 520. In some embodiments, the first and second touch electrodes 510 and 520 are formed on the same layer and an insulation layer is formed to electrically insulate the first touch electrodes 510 from the second touch electrodes 520.

The first touch electrodes 510 connected by the first touch connection portion 545 are electrically connected to a touch sensor controller (not shown) through the first touch wires 511. The second touch electrodes 520 are electrically connected to the touch sensor controller (not shown) through the second touch wires 521. The first and second touch wires 511 and 521, as illustrated in FIG. 8, are formed in the peripheral area PA, or in other embodiments, are alternatively arranged in the touch active area TA. End portions of the first and second touch wires 511 and 521 form the pad portion 560 in the peripheral area PA of the second substrate 310.

According to the embodiments of FIGS. 3 to 8 described above, only the capacitive contact sensing layer has been described, however, the described technology is not limited thereto. Contact sensing layers of various types such as resistive, capacitive, electro-magnetic (EM,) and optical sensing layer may be alternatively employed.

A display device according to another exemplary embodiment will be described hereinafter with reference to FIGS. 9 to 11.

Figure 9:
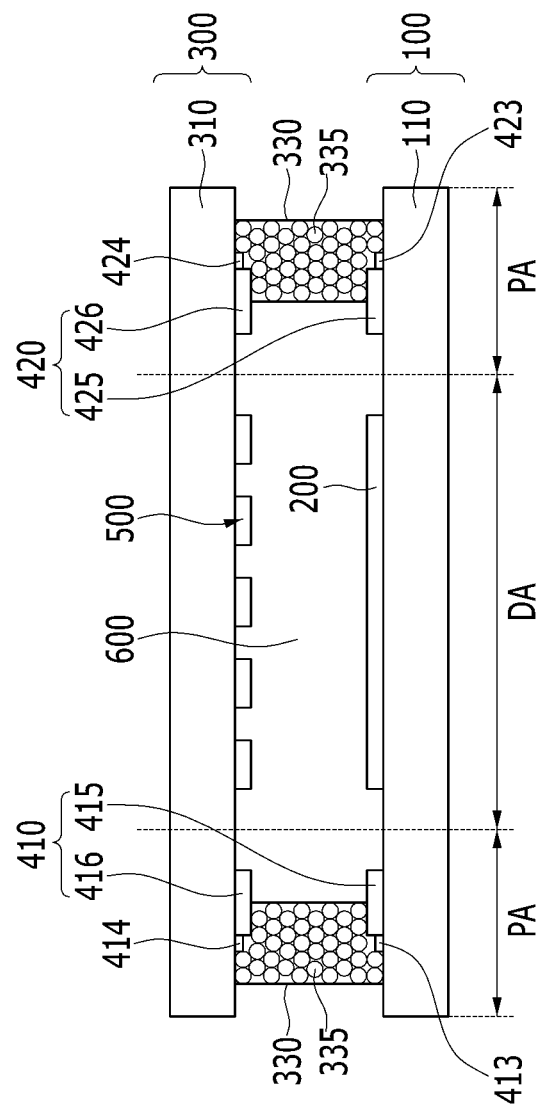
FIG. 9 is a cross-sectional view of a display device according to another exemplary embodiment.

Referring to FIG. 9, the display device includes a first panel 100, a second panel 300 facing the first panel 100, and a liquid crystal layer 600 interposed between the first and second panels 100 and 300. The first and second panels 100 and 300 are bonded to each other by a sealant 330. The sealant 330 is formed in a peripheral area PA.

A first gate driving circuit 410 and a second gate driving circuit 420 are formed in the peripheral area PA of the display device. The first and second gate driving circuits 410 and 420 apply gate driving signals to the display area DA and are respectively formed at left and right sides of the display area DA. The first and second gate driving circuits 410 and 420 are formed to partially overlap the sealant 330.

The first panel 100 includes a first substrate 110 formed of a transparent material such as glass or plastic and a thin film display layer 200. The thin film display layer 200 is formed in the display area DA on the inner side of the first substrate 110, that is, on the side facing the second panel 300. The thin film display layer 200 includes a plurality of pixels. Each pixel includes a pixel electrode 191 and a common electrode 270 for applying an electric field received from a thin film transistor to the liquid crystal layer 600 which will be described later.

The first panel 100 further includes a third lower gate driving circuit 415, a fourth lower gate driving circuit 425, a first lower contact portion 413 electrically connected to the third lower gate driving circuit 415, and a second lower contact portion 423 electrically connected to the fourth lower gate driving circuit 425. The first and second lower contact portions 413 and 423 can be formed of a conductive material. The third and fourth lower gate driving circuits 415 and 425 and the first and second lower contact portions 413 and 423 are formed on the inner side of the first substrate 110, that is, on the side facing the second panel 300. The first and second lower gate driving circuits 411 and 421 are connected to each pixel.

The second panel 300 includes a second substrate 310 formed of a transparent material such as glass or plastic and a contact sensing layer 500. The contact sensing layer 500 is formed on the inner side of the second substrate 310, that is, on the side facing the first panel 100. Thus, the contact sensing layer 500 faces the thin film display layer 200. In some embodiments, the second substrate 310 has a decreased thickness by etching an outer side thereof.

The contact sensing layer 500 according to the embodiment of FIG. 9 is substantially the same as that of the display device according to the exemplary embodiment of FIG. 1. Accordingly, the description of the contact sensing layer 500 will be omitted.

The second panel 300 includes a third upper gate driving circuit 416, a fourth upper gate driving circuit 426, a first upper contact portion 414 electrically connected to the third upper gate driving circuit 416, and a second upper contact portion 424 electrically connected to the fourth upper gate driving circuit 426. The first and second upper contact portions 414 and 424 are formed of a conductive material. The third and fourth upper gate driving circuits 416 and 426 and the first and second upper contact portions 414 and 424 are formed on the inner side of the second substrate 310, that is, on the side facing the first panel 100.

The third lower gate driving circuit 415 faces the third upper gate driving circuit 416 and the fourth lower gate driving circuit 426 faces the fourth upper gate driving circuit 426. The first lower and upper contact portions 413 and 414 face each other and the second lower and upper contact portions 423 and 424 face each other.

The sealant 330 bonds the first and second panels 100 and 300 such that it partially overlaps the third lower and upper gate driving circuits 415 and 416 as well as the fourth lower and upper gate driving circuits 425 and 426.

A plurality of conductive balls 335 formed of a conductive material are formed inside the sealant 330. The conductive balls 335 contact each other. The conductive balls 335 contact the first lower and upper contact portions 413 and 414 at a position where the sealant 330 overlaps the third lower and upper gate driving circuits 415 and 416. Thus, the first lower and upper contact portions 413 and 414 are electrically connected to each other through the conductive balls 335. Accordingly, the third lower and upper gate driving circuits 415 and 416 are electrically connected to each other. The third lower and upper gate driving circuits 415 and 416 form the first gate driving circuit 410.

In addition, the conductive balls 335 contact the second lower and upper contact portions 423 and 424 at a position where the sealant 330 overlaps the fourth lower and upper gate driving circuits 425 and 426. Thus, the second lower and upper contact portions 423 and 424 are electrically connected to each other through the conductive balls 335. Accordingly, the fourth lower and upper gate driving circuits 425 and 426 are electrically connected to each other. The fourth lower and upper gate driving circuits 425 and 426 form the second gate driving circuit 420.

The first and second gate driving circuits 410 and 420 respectively apply gate signals to the display area DA, the third and fourth lower gate driving circuits 415 and 425 respectively include a plurality of thin film transistors, and the third and fourth upper gate driving circuits 416 and 426 respectively include a plurality of capacitors.

The thin film display layer according to the present exemplary embodiment will now be described with reference to FIGS. 10 and 11. As described above, the thin film display layer 200 includes a plurality of pixels.

Figure 10:
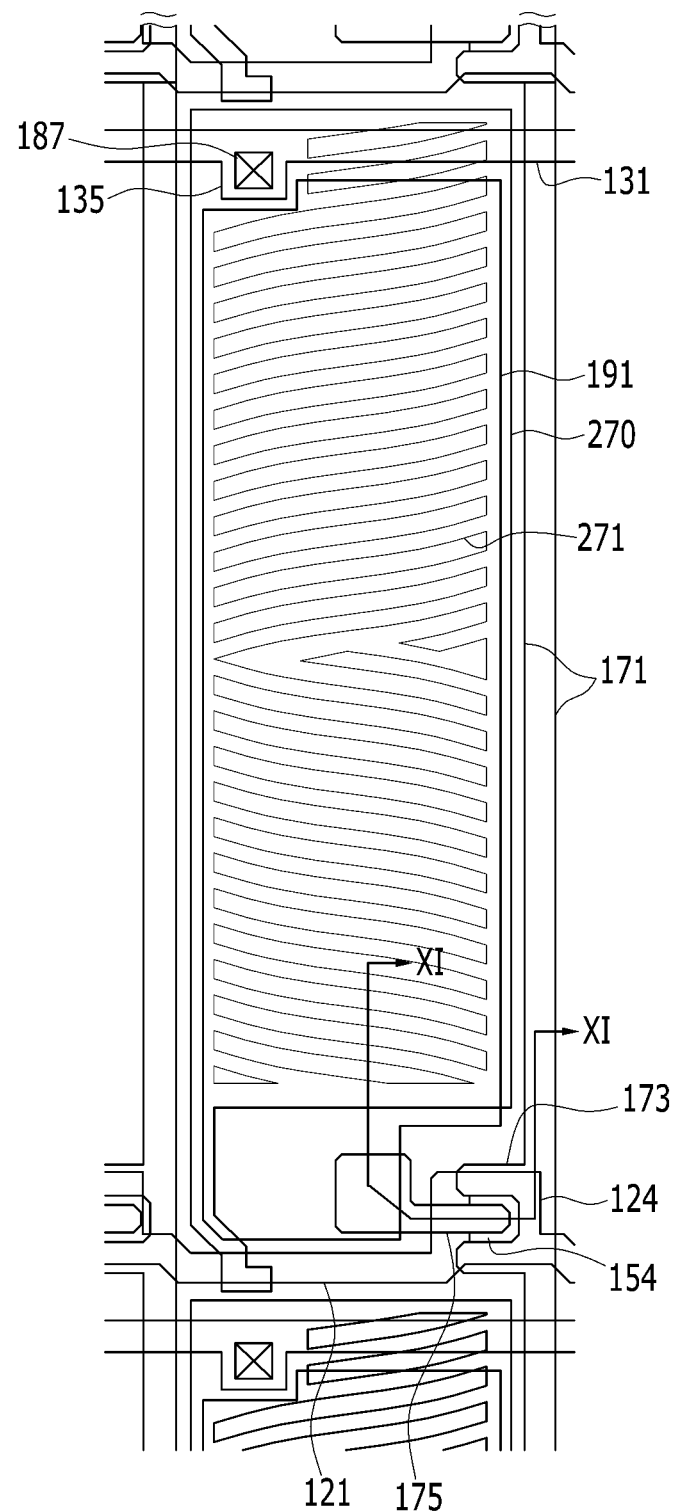
FIG. 10 is a layout view of a pixel of a display device according to another exemplary embodiment.
Figure 11:
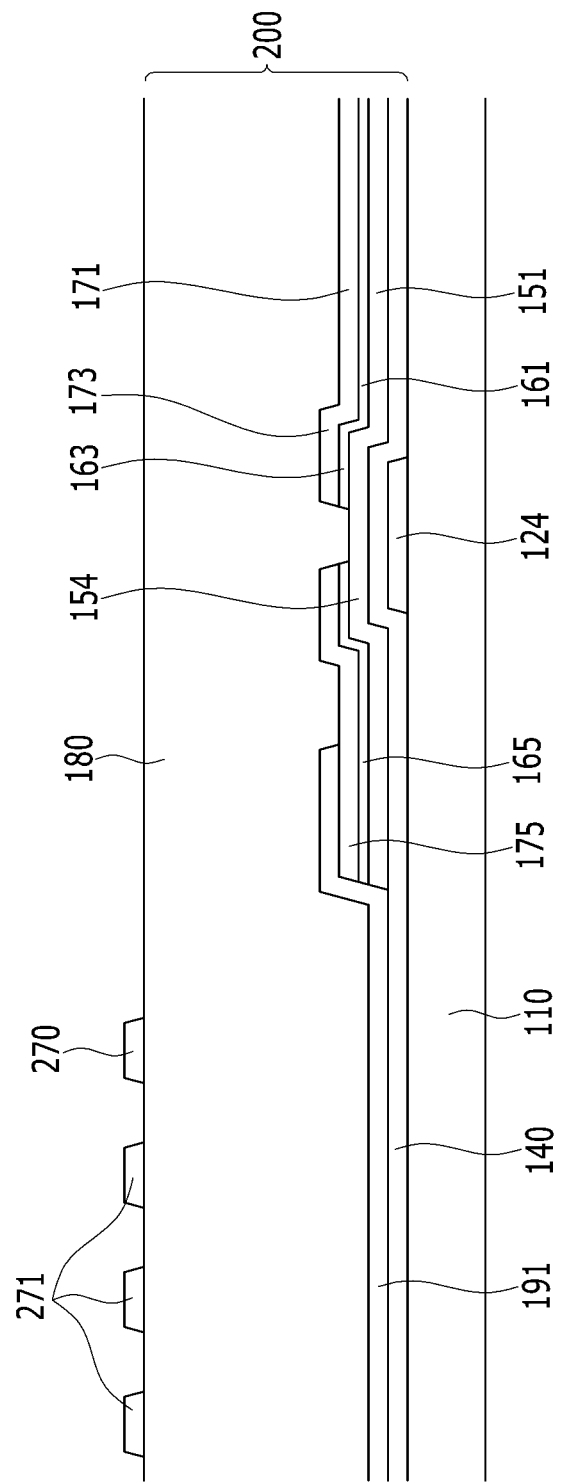
FIG. 11 is a cross-sectional view of FIG. 10 taken along the line XI-XI.

Referring to FIGS. 10 and 11, the thin film display layer 200 includes a gate line 121, a storage electrode line 131, a gate insulation layer 140, a semiconductor layer 151, stripe-shaped and island-shaped ohmic contacts 161 and 165, data lines 171, a drain electrode 175, a pixel electrode 191, a passivation layer 180, and a common electrode 270.

The gate line 121 extends in a horizontal direction and transmits a gate signal. The gate line 121 includes a plurality of gate electrodes 124 protruding upwards. The gate line 121 is electrically connected to a first gate driving circuit 410 and a second gate driving circuit 420.

The storage electrode line 131 receives a reference voltage, extends substantially parallel to the gate line 121, and includes a plurality of protrusion portions 135 protruding downwards.

The gate insulation layer 140 is formed on the gate line 121 and the storage electrode line 131 and can be formed at least partially of a silicon nitride ($SiN_x$), a silicon oxide ($SiO_x$), or a combination thereof. The gate insulation layer 140 may have a multi-layered structure in which at least two insulation layers having different physical properties are laminated.

A semiconductor 151 formed of, for example, hydrogenated amorphous silicon (referred to as a-Si) or polysilicon is formed on the gate insulation layer 140. The semiconductor layer 151 extends in a substantially vertical direction and includes a protrusion portion 154 protruding towards the gate electrode 124.

The stripe-shaped and island-shaped ohmic contacts 161 and 165 are formed on the semiconductor layer 151. The ohmic contacts 161 and 165 may be formed of n+ hydrogenated amorphous silicon highly doped with n-type impurities such as phosphorus or a silicide. The stripe-shaped ohmic contacts 161 respectively have protrusion portions 163 such that the protrusion portions 163 and the island-shaped ohmic contacts 165 are paired and formed on the protrusion portion 154 of the semiconductor layer 151.

The data lines 171 and the drain electrode 175 are formed on the ohmic contacts 161 and 165. The data lines 171 transmit data signals and extend in a vertical direction to cross the gate line 121. The data lines 171 include a source electrode 173 protruding towards the gate electrode 124.

The drain electrode 175 is separated from the data line 171 and faces the source electrode 173 based on the gate electrode 124. The drain electrode 175 includes a rod-shaped portion at one side and an extension portion having a wide area at the other side. An end portion of the rod-shaped portion is partially enclosed with the bent source electrode 173, i.e., the bent source electrode partially surrounds the drain electrode 175.

The gate electrode 124, the source electrode 173, and the drain electrode 175 form a thin film transistor (TFT) together with the protrusion portion 154 of the semiconductor layer 151. A channel of the thin film transistor is formed in the protrusion portion 154 of the semiconductor layer 151 between the source electrode 173 and drain electrode 175.

The ohmic contacts 161 and 165 are formed between the semiconductor layer 151 and the data line 171 and between the semiconductor layer 151 and the drain electrode 175 so as to lower the contact resistance between the semiconductor layer 151 and each of the data line 171 and the drain electrode 175.

A pixel electrode 191 is formed on the drain electrode 175 and the gate insulation layer 140. The pixel electrode 191 has a planar shape to cover a pixel area and directly contacts the extension portion of the drain electrodes 175 to receive the data voltage therefrom. The pixel electrode 191 can be formed of a transparent conductive material such as indium tin oxide (ITO), indium zinc oxide (IZO), or a combination thereof.

The passivation layer 180 is formed on the source electrode 173, the drain electrode 175, the protrusion portion 154 of the exposed semiconductor layer 154, and the pixel electrode 191. The passivation layer may be formed of an inorganic insulator or organic insulator and may have a smooth upper surface. Examples of the inorganic insulator include a silicon nitride and a silicon oxide. The organic insulator may have photosensitivity and its dielectric constant may preferably be less than or equal to about 4.0.

However, the passivation layer 180 may have a dual-layer structure including a lower inorganic layer and an upper organic layer in order to prevent the protrusion portion 154 of the exposed portions of the semiconductor layer 151 from being damaged while ensuring the excellent insulating characteristics of the organic layer.

A third contact hole 187 is formed in the passivation layer 180 and the gate insulation layer 140 to expose the protrusion portion 135 of the storage electrode line 131.

A common electrode 270 is formed on the passivation layer 180. The common electrode 270 can be formed of a transparent conductive material such as indium tin oxide (ITO) or indium zinc oxide (IZO). In addition, the common electrode 270 may be formed of an aluminum-based metal such as aluminum (Al) or an aluminum alloy, a silver-based metal such as silver (Ag) or a silver alloy, a molybdenum-based metal such as molybdenum (Mo) or a molybdenum alloy, a non-transparent conductive material such as a chromium (Cr), tantalum (Ta), titanium (Ti), or a combination thereof.

The common electrode 270 is connected to the protrusion portion 135 of the storage electrode line 141 through the third contact hole 187 and receives a reference voltage from the storage electrode line 131. The common electrode 270 includes a plurality of stem electrodes 271.

In some embodiments, the stem electrodes of the common electrode 270 extend in a direction substantially parallel to the gate line 121. In other embodiments, the stem electrodes are inclined to form an angle of about 5 to 20 degrees with respect to the gate line 121.

The pixel electrode 191 receives the data voltage and generates an electric field together with the common electrode 270 which receives the reference voltage. Thus, liquid crystal molecules of the liquid crystal layer 600 formed on the two electrodes 191 and 270 rotate to be oriented in a direction parallel to the electric field.

Polarization of light passing through the liquid crystal layer 600 varies depending on the orientation of the liquid crystal molecules.

While the inventive technology has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device, comprising:
a first panel;
a second panel facing the first panel; and
a sealant configured to seal together the first and second panels,
wherein the first panel comprises:
a first substrate including a display area and a peripheral area surrounding the display area;
a thin film display layer formed in the display area of the first substrate; and
a first lower gate driving circuit formed in the peripheral area of the first substrate, wherein the first lower gate driving circuit is closer to the sealant than the thin film display layer,
wherein the second panel comprises:
a second substrate including a display area and a peripheral area surrounding the display area;
a contact sensing layer formed in the display area of the second panel; and
a first upper gate driving circuit formed in the peripheral area of the second substrate, wherein the first upper gate driving circuit is closer to the sealant than the contact sensing layer, and
wherein the sealant at least partially overlaps the first lower and upper gate driving circuits and includes a plurality of conductive balls electrically connecting the first lower and upper gate driving circuits.

2. The display device of claim 1, wherein the first panel further includes a first lower contact portion formed of a conductive material and electrically connected to the first lower gate driving circuit.

3. The display device of claim 2, wherein the second panel further includes a first upper contact portion formed of the conductive material and electrically connected to the first upper gate driving circuit.

4. The display device of claim 3, wherein the sealant at least partially overlaps the first lower and upper contact portions and wherein the first lower and upper contact portions are electrically connected to each other via the conductive balls.

5. The display device of claim 4, wherein the first panel further includes:
- a second lower gate driving circuit formed in the peripheral area of the first substrate, wherein the first and second lower gate driving circuits are formed on opposing sides of the thin film display layer; and
- a second lower contact portion formed of the conductive material and electrically connected to the second lower gate driving circuit.

6. The display device of claim 5, wherein the second panel further includes a second upper gate driving circuit formed in the peripheral area of the second substrate and wherein the first and second upper gate driving circuits are formed on opposing sides of the contact sensing layer.

7. The display device of claim 6, wherein the second panel further includes a second contact portion formed of the conductive material and electrically connected to the second gate driving circuit.

8. The display device of claim 7, wherein the sealant at least partially overlaps the second lower and upper contact portions and wherein the second lower and upper contact portions are electrically connected to each other via the conductive balls.

9. The display device of claim 8, wherein the thin film display layer includes a plurality of pixels and wherein each of the pixels includes an organic light-emitting diode (OLED).

10. The display device of claim 9, wherein the first and second lower gate driving circuits are configured to apply gate signals to the thin film display layer, wherein the first upper gate driving circuit is configured to apply a light-emitting signal to the thin film display layer, and wherein the second upper gate driving circuit is configured to apply a gate initialization signal to the thin film display layer.

11. The display device of claim 8, further comprising a liquid crystal layer interposed between the first and second panels.

12. The display device of claim 11, wherein the thin film display layer includes a pixel electrode and a common electrode configured to apply an electric field to the liquid crystal layer.

13. The display device of claim 12, wherein each of the first and second lower gate driving circuits include a plurality of thin film transistors (TFTs) and wherein each of the first and second upper gate driving circuits include a plurality of capacitors.

14. The display device of claim 1, wherein the contact sensing layer includes a plurality of first touch electrodes and a plurality of second touch electrodes which are i) spaced apart from the first touch electrodes and ii) formed on the same layer as the first touch electrodes.

15. The display device of claim 14, wherein the first and second touch electrodes are alternately arranged and do not overlap each other, wherein the first touch electrodes are electrically connected to each other via a plurality of first connection portions, and wherein the second touch electrodes are electrically connected to each other via a plurality of second connection portions.

16. A display device, comprising:
- first and second substrates each including a display area and a peripheral area surrounding the display area;
- a plurality of pixels formed in the display area of the first substrate;
- first and second lower gate driving circuits configured to drive the pixels and formed in the peripheral area of the first substrate;
- first and second upper gate driving circuits configured to drive the pixels and formed in the peripheral area of the second substrate;
- first and second lower contact portions respectively electrically connected to the first and second lower driving circuits; and
- first and second upper contact portions respectively electrically connected to the first and second upper driving circuits,
- wherein the first and second upper gate driving circuits are respectively electrically connected to the first and second lower gate driving circuits via the first and second lower contact portions and the first and second upper contact portions.

17. The display device of claim 16, further comprising a sealant formed over and at least partially overlapping the first and second lower gate driving circuits in the peripheral area and at least partially overlapping the sealant, wherein the sealant is interposed between and substantially seals the first and second substrates and wherein the sealant comprises a plurality of conductive balls electrically connecting the first lower gate driving circuit to the first upper gate driving circuit and the second lower gate driving circuit to the second upper gate driving circuit.

18. The display device of claim 16, wherein the first lower and upper contact portions are electrically connected via the conductive balls and wherein the second lower and upper contact portions are electrically connected via the conductive balls.

19. The display device of claim 16, wherein the first and second lower gate driving circuits are configured to apply gate signals to the pixels, wherein the first upper gate driving circuit is configured to apply a light-emitting signal to the pixels, and wherein the second upper gate driving circuit is configured to apply a gate initialization signal to the pixels.

20. The display device of claim 16, further comprising a contact sensing layer formed under the second substrate and interposed between the first and second upper gate driving circuits, wherein the contact sensing layer is electrically insulated from the first and second upper gate driving circuits.

* * * * *